United States Patent

Sato

[11] Patent Number: 5,963,470
[45] Date of Patent: Oct. 5, 1999

[54] STATIC SEMICONDUCTOR MEMORY CELL WITH IMPROVED DATA RETENTION STABILITY

[75] Inventor: Hirotoshi Sato, Hyogo, Japan

[73] Assignee: Mitsubishi Denki Kabushiki Kaisha, Tokyo, Japan

[21] Appl. No.: 09/019,560

[22] Filed: Feb. 6, 1998

[30] Foreign Application Priority Data

Jul. 16, 1997 [JP] Japan .................................. 9-191430

[51] Int. Cl.⁶ .................................................. G11C 11/00
[52] U.S. Cl. ........................ 365/154; 365/156; 365/177; 365/225.6
[58] Field of Search ................................. 365/154, 156, 365/177, 225.6

[56] References Cited

U.S. PATENT DOCUMENTS 4,868,628 9/1989 Simmons .
5,483,483 1/1996 Choi et al. .
5,740,102 4/1998 Kawashima ............................... 365/154
5,764,565 6/1998 Sato et al. ................................ 365/154

*Primary Examiner*—Huan Hoang
*Attorney, Agent, or Firm*—McDermott, Will & Emery

[57] ABSTRACT

In a SRAM cell including a bipolar transistor and a cut transistor, the threshold Vtheff (Driver) of driver transistor and the threshold Vtheff (Cut) of cut transistor are set such that they satisfy the expressions, $$Vtheff(Driver) \geq [\{\log(1\ \mu A)\} - \{\log(Vcc/10R)\}] \times S \quad (1)$$

$$[\{\log(1\ \mu A)\} - \{\log((Iex(1/(hFE+1)))/10)\}] \times S$$
$$\leq Vtheff(Cut) \leq [\{\log(1\ \mu A)\} - \{\log(Vcc/R)\}] \times S \quad (2)$$

$$Vtheff(Cut) - S \leq Vtheff(Ac) \quad (3)$$

3 Claims, 4 Drawing Sheets

STATIC SEMICONDUCTOR MEMORY CELL WITH IMPROVED DATA RETENTION STABILITY

CROSS-REFERENCE TO RELATED APPLICATIONS

This application is related to copending application Ser. No. 08/734,333, filed Oct. 21, 1996, commonly assigned with the present invention.

BACKGROUND OF THE INVENTION

1. Field of the Invention

The present invention relates to a static semiconductor memory cell which stores data.

2. Description of the Background Art

FIG. 4 is a circuit diagram showing a static random access memory (in the following also referred to as "SRAM") included in a conventional static semiconductor memory device and its peripheral circuitry.

As shown in FIG. 4, the static semiconductor memory device is provided with, a word line WL, a bit line pair $BL$,/BL, SRAM cells M1, Mn arranged at their crossing, transfer gates 211, 212 and equalize/precharge circuits 200, 209 corresponding to each bit line pair $BL$,/BL, and a sense amplifier 215.

Each of SRAM cells M1, Mn includes two NMOS transistors 202, 205 and two inverters 203, 204.

FIG. 5 is a circuit diagram showing a configuration of each of SRAM cells M1, Mn shown in FIG. 4. Referring to FIG. 5, each of SRAM cells M1, Mn includes driver transistors 226, 227, access transistors 220, 221 and high resistance elements 222, 223.

In the following, a data read out operation of a conventional static semiconductor memory device in which SRAM cell M1 is selected will be described with reference to FIG. 4.

The potential of bit line pair $BL$,/BL is precharged to a high level (H: logical high). When word line WL is activated, potential of bit line pair $BL$,/BL changes according to information stored in SRAM cell M1. When word line WL is activated, transfer gate 211 corresponding to selected SRAM cell M1 is turned on simultaneously. Namely, only a column selection signal Y1 attains a high level. Column selection signals Y2–Yn attain a low level (L: logical low). Corresponding to the potential difference between bit lines BL and /BL, potential difference is generated between data line pair 213 and 214, which is amplified by sense amplifier 215.

However, in the conventional static semiconductor memory device as described above, at a low voltage, drivability suddenly decreases, so that the ratio of current drivability between driver transistors 226, 227 and access transistors 220, 221 decreases. Therefore stability is degraded causing destruction of data.

SUMMARY OF THE INVENTION

The object of the present invention is to provide a static semiconductor memory cell which can have data retention stability improved.

According to one aspect of the invention, a static semiconductor memory cell is provided with, a ground node, a first bipolar transistor with an emitter connected to a bit line and a collector connected to the ground node, a first storage node, a first access transistor connected between a base of the first bipolar transistor and the first storage node, with a gate connected to a first word line, a power supply node, a first high resistance load connected between the power supply node and the first storage node, a second storage node, a first driver transistor with a drain connected to the first storage node and a gate connected to the second storage node, a first cut transistor connected between the ground node and the first driver transistor, with a gate connected to a second word line, a second high resistance load connected between the power supply node and the second storage node, a second driver transistor with a drain connected to the second storage node and a gate connected to the first storage node, a second cut transistor connected between the ground node and the second driver transistor, with a gate connected to the first word line, a second bipolar transistor with an emitter connected to a complementary bit line and a collector connected to the ground node, and a second access transistor connected between a base of the second bipolar transistor and the second storage node, with a gate connected to the second word line. Threshold of the first and the second driver transistors are set such that the potential of the first or the second storage node in which high level data is stored is held.

According to a static semiconductor memory cell of another aspect of the invention, the threshold of the first cut transistor is set such that at an off state, a current greater than both the current in the first high resistance load and the current in the first access transistor at an off state flows, and the potential of the first storage node is held at a high level when a high level data is written to the first storage node. Threshold of the second cut transistor is set such that at an off state, a current greater than both the current in the second high resistance load and the current in the second access transistor at an off state flows, and the potential of the second storage node is held at a high level when a high level data is written to the second storage node.

Therefore, a primary advantage of the present invention is that, the lower limit of operational voltage can be lowered and that data stored can be retained stably.

In addition, another advantage of the present invention is that data writing can be performed reliably and that data read out can be implemented stably.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
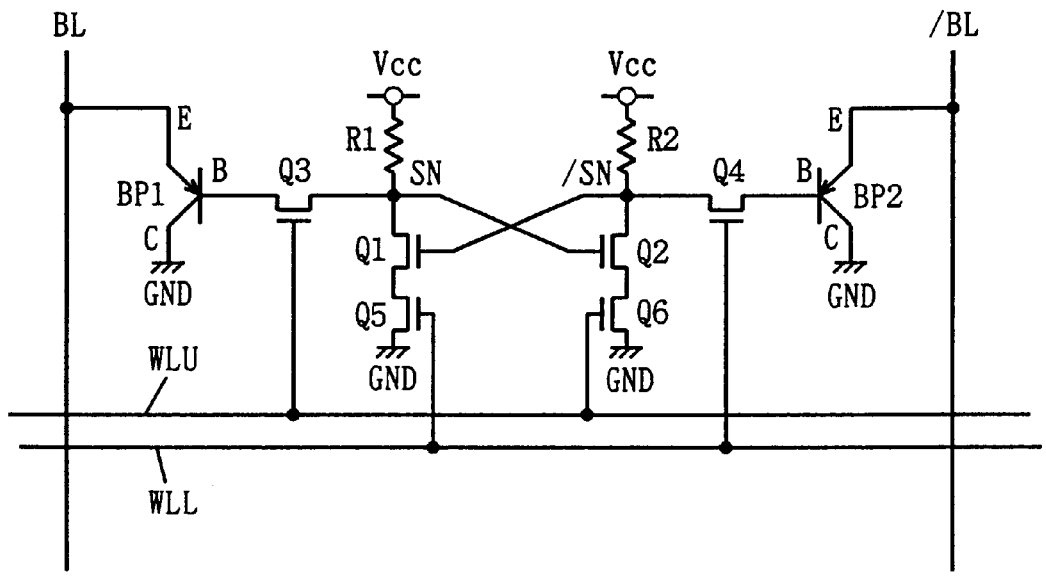
FIG. 1 is a circuit diagram showing a configuration of a SRAM cell according to an embodiment of the present invention.

In the following, embodiments of the present invention will be described in detail referring to the drawings. The same or similar characters in the drawings represent the same or corresponding parts.

Figure 5:
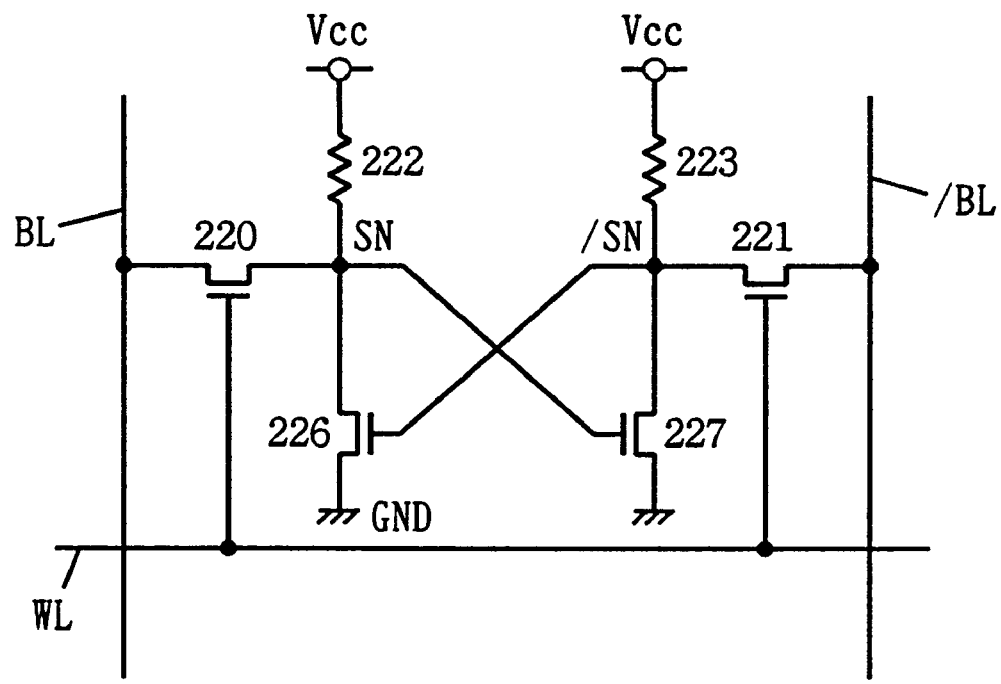
FIG. 5 is a circuit diagram showing a specific structure o the SRAM cell shown in FIG. 4.

In the conventional SRAM cell shown in FIG. 5, the following design is necessary in order to increase static noise margin and ensure data retention.

Let the channel width and channel length of driver transistors 226, 227 be represented as Wd, Ld, respectively, and the channel width and the channel length of access transistors 220, 221 be represented as Wa, La respectively. In order to increase static noise margin, the ratio of (Wd/Ld) is generally set about three times the ratio of (Wa/La). Therefore, it is necessary to increase the area of driver transistors 226, 227. This induces the problem that the total area of the SRAM cell is increased. Further, there is another problem. When a low-voltage power supply is used, static noise margin is reduced to degrade data retention.

A SRAM cell according to the embodiment of the present invention includes two bipolar transistors, two driver transistors, and two access transistors as described hereinafter, in order to solve the problems described above.

FIG. 1 is a circuit diagram showing a configuration of the SRAM cell according to the embodiment of the present invention.

As shown in FIG. 1, the SRAM cell includes ground node GND, bipolar transistor BP1 with emitter E connected to bit line BL and collector C connected to ground node GND, storage node SN, access transistor Q3 connected between base B of bipolar transistor BP1 and storage node SN with a gate connected to word line WLU, power supply node Vcc, high resistance element R1 connected between power supply node Vcc and storage node SN, storage node/SN, driver transistor Q1 with a drain connected to storage node SN and a gate connected to storage node/SN, cut transistor Q5 connected between ground node GND and driver transistor Q1 with a gate connected to word line WLL, high resistance element R2 connected between power supply node Vcc and storage node/SN, driver transistor Q2 with a drain connected to storage node/SN and a gate connected to storage node SN, cut transistor Q6 connected between ground node GND and driver transistor Q2, with a gate connected to word line WLU, bipolar transistor BP2 with emitter E connected to complimentary bit line/BL and collector C connected to ground node GND, and access transistor Q4 connected between base B of bipolar transistor BP2 and storage node/SN, with a gate connected to word line WLL.

Here, bipolar transistor BP1, BP2 are of the PNP type. Driver transistors Q1, Q2, cut transistors Q5, Q6 and access transistors Q3, A4 are N channel MOS transistors.

Next, a fundamental operation of the SRAM cell, i.e., a writing operation and a reading out operation of data will be described.

First, a writing operation of data of a high level is described as an example.

Row selection is performed by driving word lines WLU, WLL. At the time of writing data of a high level, the potential of word line WLU attains a high level and the potential of word line WLL attains a low level. When not selected, the potential of two word lines WLU, WLL both attain the low level.

In a non-selected column, the potential of bit lines BL,/BL attain a low level. However, at the time of data writing, they attain a high level. In this manner, at the time of data writing, the potential of bit line BL is driven to a high level. Therefore the potential of base B of bipolar transistor BP1 whose emitter E is connected to bit line BL attains a level lower than that of bit line BL by the emitter-base potential Vbe because of the PN diode formed there. At this time, current flows from emitter E to base B. Here, the ratio of base current to collector current depends upon the current amplification rate of bipolar transistor BP1. Generally, the collector current is larger.

In addtion, base current flows into storage node SN, raising the potential of storage node SN. When the potential of storage node SN exceeds the threshold of driver transistor Q2, driver transistor Q2 is turned on, pulling down the potential of storage node/SN. In response, driver transistor Q1 is turned off, whereby the base current of bipolar transistor BP1 is cut off. Therefore if a great collector current flows temporarily at the onset of data writing, it is cut off immediately.

Here, as cut transistor Q5 is off and cut transistor Q6 is on, storage node SN readily rises to a high level whereas storage node/SN attains a low level.

The above description corresponding to writing data of a high level also applies to writing data of a low level, provided that word line WLL attains a high level.

Next, reading out operation of data will be described with the case in which data of a high level is written to storage node SN, as an example. First, bit line pair BL,/BL precharged to a low level is pulled up. At this time two word lines WLU, WLL are activated to a high level.

With the increase in the potential of bit line pair BL,/BL, bipolar transistor BP2 connected to storage node/SN holding a low level potential is activated suppressing the increase in potential of bit line/BL. On the other hand, as bipolar transistor BP1 connected to storage node SN holding a high level potential is not activated, bit line BL is continuously pulled up. Thus, potential difference is generated between bit lines BL and /BL, whereby data of high level is read out.

Figure 2:
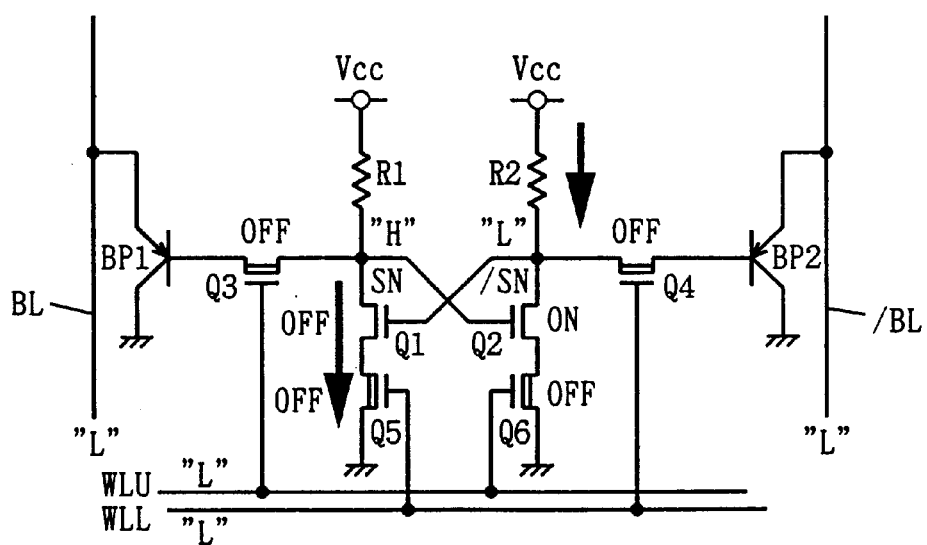
FIG. 2 is a diagram showing the SRAM cell of FIG. 1 at a standby state.

Above is the fundamental operation of SRAM cell according to the preferred embodiment. Next, referring to FIG. 2, a standby state, when high level potential and low level potential are held in storage node SN and storage node/SN respectively, will be described.

In the following, threshold Vtheff of driver transistors Q1, Q2 and cut transistors Q5, Q6 represent gate-source voltage necessary to conduct a drain current of 1 $\mu$A in a transistor of the size actually used.

At the standby state, two word lines WLU, WLL are both inactivated to a low level, and bit line pair BL,/BL is precharged to a low level and equalized. Therefore, although cut transistors Q5, Q6 are in an inactive state, leakage current flows because of the low threshold. This leakage current flow in cut transistor Q6 causes the potential of storage node/SN having a low level to be held.

Additionally, what is important here is that storage node SN having a high level potential is held at a sufficiently high level by high resistance element R1. If the resistance value of high resistance elements R1, R2 is represented as R (High), the current I (High) flowing in one of high resistance elements R1, R2, when supply voltage is Vcc, is represented as $$I(High) = Vcc/R(High) \tag{1}$$

(However, in practice, supply voltage Vcc is not applied to high resistance element R1. A voltage of small magnitude caused by the potential difference between power supply node and storage node SN is applied). At the standby state, driver transistor Q1 whose drain is connected to storage node SN which holds a potential of high level, is off. Off leak current I (Driver-off) at this time must be sufficiently smaller than the current I (High) flow in high resistance element. Namely, the relationship of $$I(\text{Driver-off}) << I(\text{High}) \quad (2)$$

must be established.

Here, a margin is provided by setting off leak current I (Driver-off) smaller than the one tenth of current I (High). Namely, if $$I(\text{Driver-off}) \leq I(\text{High})/10 = Vcc/R(\text{High})/10, \quad (3)$$

threshold Vtheff (Driver) of driver transistor Q1 satisfies the following relationship.

$$Vtheff(\text{Driver}) = [\{\log(1\ \mu A)\} - \{\log(I(\text{Driver-off}))\}] \times S$$

$$\geq [\{\log(1\ \mu A)\} - \{\log(Vcc/R(\text{High})/10)\}] \times S \quad (4)$$

where subthreshold factor S represents the gate voltage change necessary to make the volume of drain current flowing in driver transistor Q1 one order of magnitude larger (S=90 mV approximately in an actual N-channel MOS transistor).

Next, driver transistor Q2 whose drain is connected to storage node/SN which holds a low level potential and cut transistor Q6 which is connected in series with driver transistor Q2 will be described. Here, driver transistor Q2 is on and cut transistor Q6 is off. Cut transistor Q6 pulls down the potential of storage node/SN to a low level by off leak current. Therefore off leak current I (Cut-off) flowing in cut transistor Q6 must be sufficiently larger than the current I (High) flowing in high resistance element R2 as shown below.

$$I(\text{Cut-off}) >> I(\text{High}) = Vcc/R(\text{High}) \quad (5)$$

Here, with a margin provided by setting off leak current I (Cut-off) more than ten times greater than the current I (High), the threshold Vtheff (Cut) of cut transistor Q6 satisfies the following relationship.

$$Vtheff(Cut) = [\{\log(1\ \mu A)\} - \{\log(I(\text{Cut-off}))\}] \times S$$

$$A \leq [\{\log(1\ \mu A)\} - \{\log(Vcc/R(\text{High}))\}] \times S \quad (6)$$

In determining the thresholds Vtheff of driver transistor Q1 and cut transistor Q6, one tenth (one order) of each current is considered as a margin. However, it is preferable in practice to provide a margin of about one hundredth. The same applies to the following description.

Figure 3:
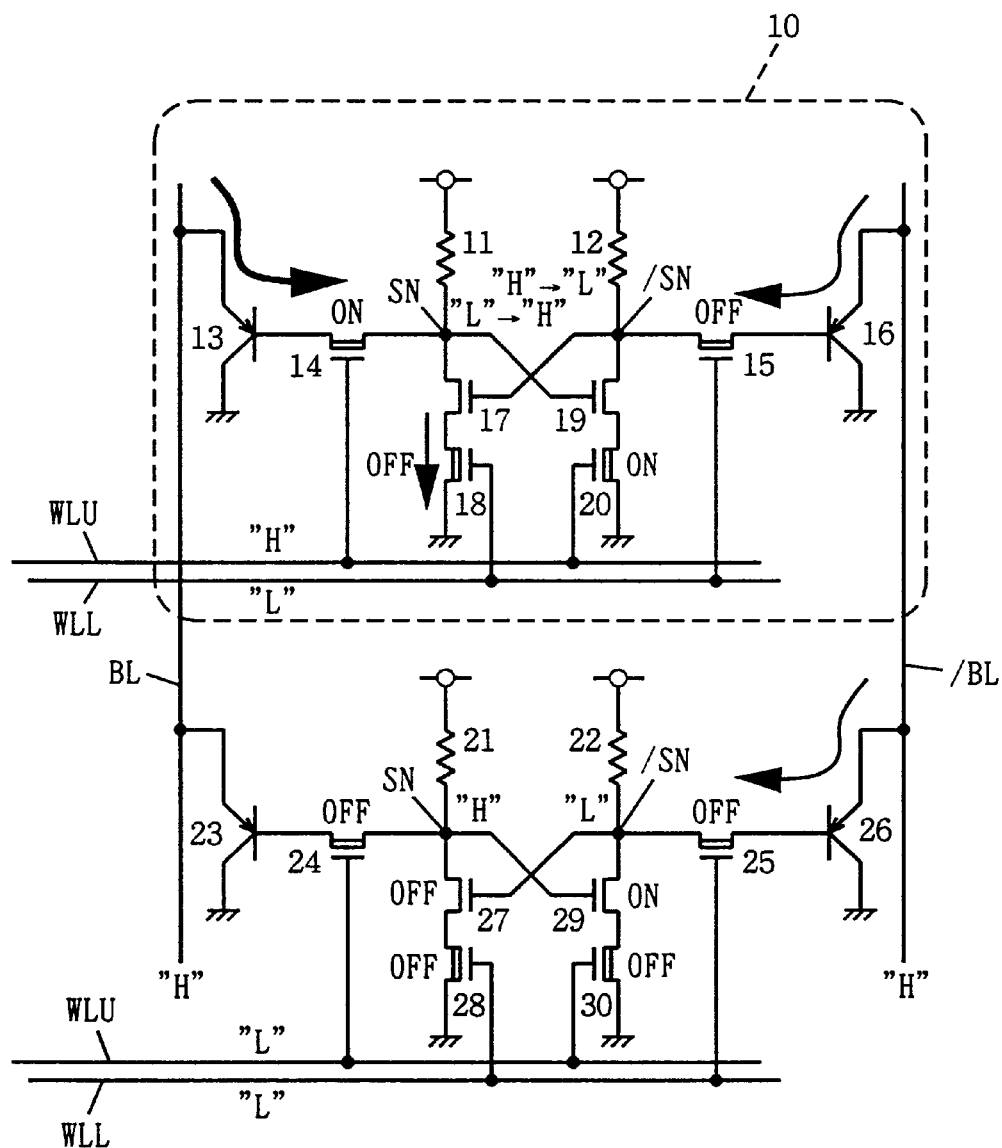
FIG. 3 is a diagram for describing a writing operation of the SRAM cell shown in FIG. 1.
Figure 4:
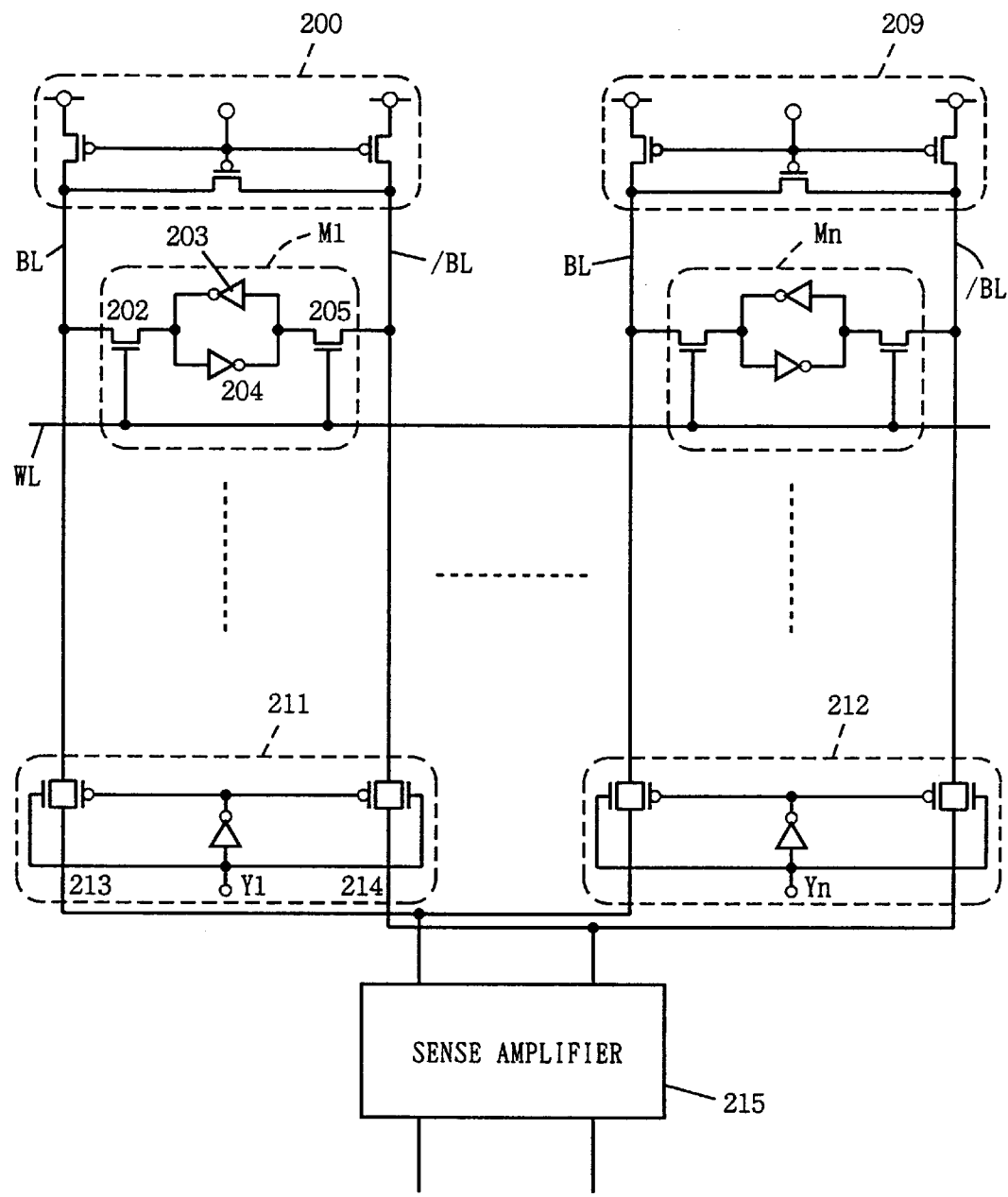
FIG. 4 is a diagram showing a configuration of a conventional static semiconductor memory device.

Next, referring to FIG. 3, the state of SRAM cell according to the preferred embodiment at the time of data writing operation will be described with the case in which high level data is written to storage node SN as an example.

At the time of data writing, bit lines BL,/BL precharged to a low level are pulled up to a high level. By applying a high level bit line potential to storage node SN via bipolar transistor 13 and access transistor 14 included in selected cell 10, high level data writing is performed. At this time as word line WLU alone is activated to a high level, cut transistor 18 series connected to access transistor 14 is off. Therefore it is easy to pull up the potential of storage node SN.

Here, in selected cell 10, it is necessary to conduct a base current greater than the off leak current flow in cut transistor 18 at an off state into storage node SN by bipolar transistor 13. The current Ib flow between the emitter and the base of bipolar transistor 13 is represented as, $$Ib = Ie \times (1/(hFE+1)) \quad (7)$$

where Ie and hFE represent, emitter current flowing into bipolar transistor 13 and the current amplification rate of bipolar transistor 13, when bit line BL attains a high level, respectively. Here, when margin is provided such that the off leak current flow into cut transistor 18 becomes not more than one tenth of current Ib, the following relationships must be established.

$$I(\text{Cut-off}) \leq Ib/10 = \{Ie \times (1/(hFE+1))\}/10 \quad (8)$$

$$Vtheff(Cut) = [\{\log(1\ \mu A)\} - \{\log(I(\text{Cut-off}))\}] \times S$$

$$\geq [\{\log(1\ \mu A)\} - \{\log((Ie \times (1/(hFE+1)))/10)\}] \times S \quad (9)$$

Next, a non-selected cell included in a selected column will be described.

As driver transistor 29 whose drain is connected to storage node/SN which holds low level potential is on, and cut transistor 30 is off, the low level potential of storage node/SN is held by the off leak current flow in cut transistor 30.

Here, a margin is provided such that off leak current I (Cut-off) of cut transistor 30 is not less than ten times of off leak current I (Ac-off) of access transistor 25. Namely, if the relationship $$I(\text{Cut-off}) \geq 10 \cdot I(\text{Ac-off}) \quad (10)$$

is established, it is necessary that the threshold Vtheff (Cut) of cut transistor 30 satisfies the following relationship with the threshold Vtheff (Ac) of access transistor 25.

$$Vtheff(Cut) \leq Vtheff(Ac) + S \quad (11)$$

In accordance with the above description, the thresholds of the driver transistor and the cut transistor included in the SRAM cell according to the preferred embodiment, each represented as Vtheff (Driver) and Vtheff (Cut), are set to the values which satisfy the following expression, respectively.

$$Vtheff(\text{Driver}) \geq [\{\log(1\ \mu A)\} - \{\log(Vcc/R(\text{High})/10)\}] \times S \quad (4)$$

$$[\{\log(1\ \mu A)\} - \{\log((Ie \times (1/(hFE+1)))/10)\}] \times S \leq Vtheff(Cut)$$

$$\leq [\{\log(1\ \mu A)\} - \{\log(Vcc/R(\text{High}))\}] \times S \quad (12)$$

$$Vtheff(Cut) \leq Vtheff(Ac) + S \quad (11)$$

The setting of the threshold Vtheff above is implemented by an appropriate ion implantation in the manufacturing process of driver transistor and cut transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static semiconductor memory cell, comprising:
   a ground node;
   a first bipolar transistor with an emitter connected to a bit line and a collector connected to said ground node;
   a first storage node;
   a first access transistor connected between a base of said first bipolar transistor and said first storage node, with a gate connected to a first word line;
   a power supply node;
   a first high resistance load connected between said power supply node and said first storage node;

a second storage node;

a first driver transistor with a drain connected to said first storage node and a gate connected to said second storage node;

a first cut transistor connected between said ground node and said first driver transistor, with a gate connected to a second word line;

a second high resistance load connected between said power supply node and said second storage node;

a second driver transistor with a drain connected to said second storage node and a gate connected to said first storage node;

a second cut transistor connected between said ground node and said second driver transistor, with a gate connected to said first word line;

a second bipolar transistor with an emitter connected to a complementary bit line and a collector connected to said ground node; and a second access transistor connected between a base of said second bipolar transistor and said second storage node, with a gate connected to said second word line, wherein thresholds of said first and said second driver transistors are set such that potential of said first or said second storage node storing high level data is held, wherein when a voltage supplied to said power supply node is represented as Vcc, each resistance value of said first and said second high resistance loads is represented as R, and variation of gate voltage necessary for increasing a drain current flowing in said first or said second driver transistor by ten times is represented as S, a threshold Vtheff (Driver) of each of said first and said second driver transistors for conducting a drain current by 1 $\mu$A is set such that it satisfies an expression (1), $$Vtheff(\text{Driver}) \geq [\{\log(1\ \mu A)\} - \{\log(Vcc/10R)\}] \times S \qquad (1).$$

2. The static semiconductor memory cell according to claim 1, wherein when an emitter current flowing in each of said first and said second bipolar transistors is represented as Ie, current amplification rate of each of said first and said second bipolar transistors is represented as hFE, and a threshold of each of said first and said second access transistors is represented as Vtheff (Ac), a threshold Vtheff (Cut) of each of said first and said second cut transistors for conducting a drain current by 1 $\mu$A is set such that it satisfies an expression (2), $$[\{\log(1\ \mu A)\} - \{\log((Ie \times (1/(hFE+1)))/10)\}] \times S \qquad (2)$$
$$\leq Vtheff(\text{Cut}) \leq [\{\log(1\ \mu A)\} - \{log(Vcc/R)\}] \times S$$

and an expression (3), $$Vtheff(\text{Cut}) - S \leq Vtheff(Ac) \qquad (3).$$

3. A static semiconductor memory cell, comprising:

a ground node;

a first bipolar transistor with an emitter connected to a bit line and a collector connected to said ground node;

a first storage node;

a first access transistor connected between a base of said first bipolar transistor and said first storage node, with a gate connected to a first word line;

a power supply node;

a first high resistance load connected between said power supply node and said first storage node;

a second storage node;

a first driver transistor with a drain connected to said first storage node and a gate connected to said second storage node;

a first cut transistor connected between said around node and said first driver transistor, with a gate connected to a second word line;

a second high resistance load connected between said power supply node and said second storage node;

a second driver transistor with a drain connected to said second storage node and a gate connected to said first storage node;

a second cut transistor connected between said ground node and said second driver transistor, with a gate connected to said first word line;

a second bipolar transistor with an emitter connected to a complementary bit line and a collector connected to said ground node; and a second access transistor connected between a base of said second bipolar transistor and said second storage node, with a gate connected to said second word line, wherein thresholds of said first and said second driver transistors are set such that potential of said first or said second storage node storing high level data is held, wherein a threshold of said first cut transistor is set such that at an off state a current greater than both a current in said first high resistance load and a current in said first access transistor at an off state flows, and the potential of said first storage node storing said high level data is held at a high level, and a threshold of said second cut transistor is set such that at an off state a current greater than both a current in said second high resistance load and a current in said second access transistor at an off state flows, and the potential of said second storage node storing said high level data is held at a high level.

* * * * *